(12) United States Patent
Flett

(10) Patent No.: US 7,676,911 B2
(45) Date of Patent: Mar. 16, 2010

(54) METHOD TO REDUCE MODULE INDUCTANCE

(75) Inventor: Fred Flett, Bloomfield, MI (US)

(73) Assignee: Continental Automotive Systems US, Inc., Auburn Hills, MI (US)

(*) Notice: Subject to any disclaimer, the term of this patent is extended or adjusted under 35 U.S.C. 154(b) by 69 days.

(21) Appl. No.: 11/673,279

(22) Filed: Feb. 9, 2007

(65) Prior Publication Data

US 2007/0193763 A1 Aug. 23, 2007

Related U.S. Application Data

(60) Division of application No. 11/292,870, filed on Dec. 2, 2005, now Pat. No. 7,193,860, which is a continuation of application No. 10/109,555, filed on Mar. 27, 2002, now Pat. No. 7,012,810, and a continuation-in-part of application No. PCT/US01/29504, filed on Sep. 20, 2001, which is a continuation-in-part of application No. 09/882,708, filed on Jun. 15, 2001, now abandoned.

(60) Provisional application No. 60/233,996, filed on Sep. 20, 2000, provisional application No. 60/233,995, filed on Sep. 20, 2000, provisional application No. 60/233,994, filed on Sep. 20, 2000, provisional application No. 60/233,993, filed on Sep. 20, 2000, provisional application No. 60/233,992, filed on Sep. 20, 2000.

(51) Int. Cl.
*H01R 43/00* (2006.01)

(52) U.S. Cl. .................. 29/825; 29/592.1; 29/596; 29/830

(58) Field of Classification Search ............... 29/592.1, 29/596, 825, 830
See application file for complete search history.

(56) References Cited

U.S. PATENT DOCUMENTS

| | | | | | |
|---|---|---|---|---|---|
| 5,687,072 | A | * | 11/1997 | Rinehart | 363/132 |
| 5,798,916 | A | * | 8/1998 | Stacey et al. | 363/135 |
| 5,909,350 | A | * | 6/1999 | Anthony | 361/118 |
| 5,960,346 | A | * | 9/1999 | Holshouser | 455/436 |
| 6,249,024 | B1 | * | 6/2001 | Mangtani | 257/341 |
| 6,373,673 | B1 | * | 4/2002 | Anthony | 361/117 |

FOREIGN PATENT DOCUMENTS

JP 9-117-126 * 9/1997

* cited by examiner

*Primary Examiner*—C. J Arbes

(57) ABSTRACT

A DC bus for use in a power module has a positive DC conductor bus plate parallel with a negative DC conductor bus plate. One or more positive leads are connected to the positive bus and are connectable to a positive terminal of a power source. One or more negative leads are connected to the negative bus and are connectable to a negative terminal of a power source. The DC bus has one or more positive connections fastenable from the positive bus to the high side of a power module. The DC bus also has one or more negative connections fastenable from the negative bus to the low side of the power module. The positive bus and negative bus permit counter-flow of currents, thereby canceling magnetic fields and their associated inductances, and the positive and negative bus are connectable to the center portion of a power module.

9 Claims, 10 Drawing Sheets

SECTION A-A

SECTION B-B

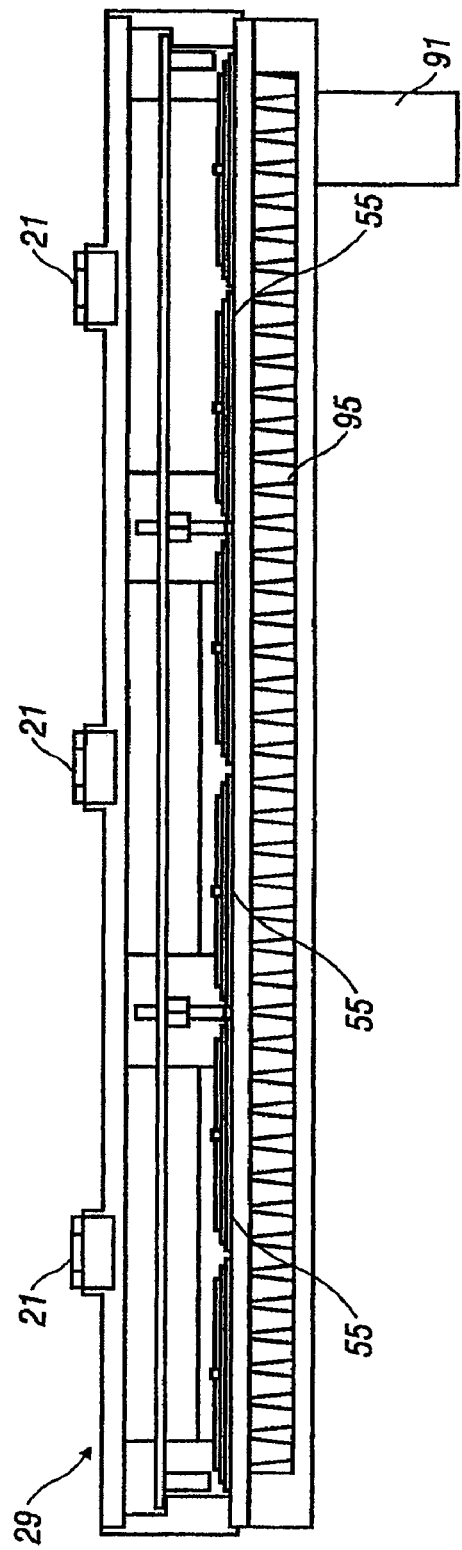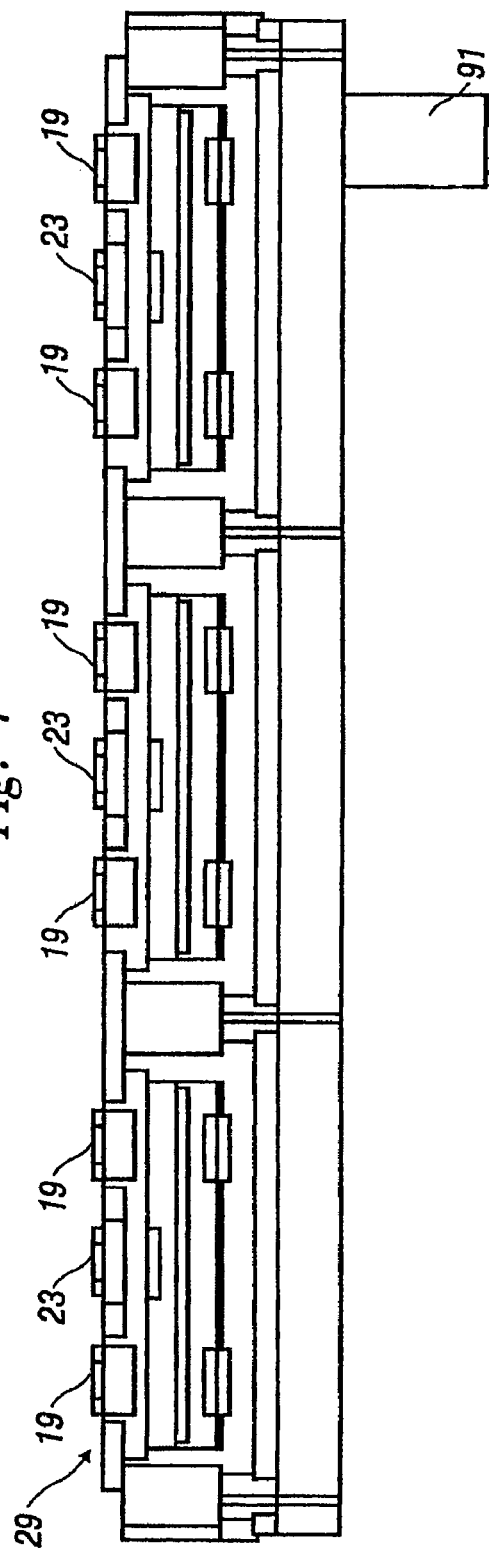

METHOD TO REDUCE MODULE INDUCTANCE

CROSS REFERENCE TO RELATED APPLICATIONS

This patent application incorporates by reference in its entirety, and is a divisional of the currently co-pending U.S. patent application Ser. No. 11/292,870, having a filing date of 2 Dec. 2005; which is a divisional of the currently U.S. patent application Ser. No. 10/109,555, having a filing date of 27 Mar. 2002, and now issued as U.S. Pat. No. 7,012,810 on 14 Mar. 2006; which is a continuation-in-part of both the currently co-pending U.S. patent application Ser. No. 09/882,708, having a filing date of 15 Jun. 2001, and of PCT Application No. US01/029504, having a filing date of 20 Sep. 2001, and now issued as Pat. No. WO 02/25704 A2 on 28 Mar. 2002; and claims priority from the foregoing applications, and any parents of the foregoing applications, under the auspices of 35 U.S.C. § 120.

This patent application also incorporates by reference in its entirety any subject matter previously incorporated by reference into the foregoing-referenced currently co-pending U.S. Patent Applications. In particular, this patent application incorporates by reference in their entireties the subject matter of U.S. Provisional Application No. 60/233,996, filed 20 Sep. 2000, and entitled, "Substrate-Level DC Bus Design to Reduce Module Inductance"; U.S. Provisional Application No. 60/233,995, filed 20 Sep. 2000, and entitled, "Leadframe-Based Module DC Bus Design to Reduce Module Inductance"; U.S. Provisional Application No. 60/233,994, filed 20 Sep. 2000, and entitled, "Both-Side Solderable Power Devices to Reduce Electrical Interconnects"; U.S. Provisional Application No. 60/233,993, filed 20 Sep. 2000, and entitled "Leadframe-Based Module DC Bus Design to Reduce Module Inductance"; U.S. Provisional Application No. 60/233,992, filed 20 Sep. 2000, and entitled "Press (Non-Soldered) Contacts for High Current electrical Connections in Power Modules"; U.S. patent application Ser. No. 09/957,568, filed 20 Sep. 2001, issued as U.S. Pat. No. 6,845,017 on 18 Jan. 2005, and entitled, "Substrate-Level DC Bus Design to Reduce Module Inductance"; U.S. patent application Ser. No. 09/957,047, filed 20 Sep. 2001, issued as U.S. Pat. No. 6,793,502 on 21 Sep. 2004, and entitled, "Press (Non-Soldered) Contacts for High Current Electrical Connections in Power Modules"; and U.S. patent application Ser. No. 09/957,001, filed 20 Sep. 2001, issued as U.S. Pat. No. 6,636,429 on 21 Oct. 2003, and entitled, "EMI Reduction in Power Modules Through the Use of Integrated Capacitors on the Substrate Level," such subject matter being previously incorporated by reference into the currently co-pending U.S. Patent Applications.

Each of the foregoing-referenced applications is hereby incorporated by reference herein in its entirety.

BACKGROUND OF THE INVENTION

1. Field of the Invention

The invention relates to the field of electronics. More specifically, the invention relates to direct current buses ("DC buses") used in power modules.

2. Description of the Related Art

An inverter power module is commonly used to convert direct current ("DC") to alternating current ("AC") to power a three-phase motor. The power module typically has three pairs of switches on a substrate that is secured to the module baseplate. Each switching pair has a positive or "high" side switch and a negative or "low" side switch for controlling the flow of electric current. Each switching pair is referred to herein as a "bridge," and each half of the switching pair is referred to as a "half-bridge." The "high side" of the bridge contains the positive switches, and the "low side" contains the negative switches. By the term "switch" is meant a switching device such as an insulated gate bipolar transistor ("IGBT") or Metal Oxide Semiconductor ("MOS") or Metal Oxide Semiconductor Field Effect Transistor ("MOSFET").

Elements may be described herein as "positive" or "negative." An element described as "positive" is shaped and positioned to be at a higher relative voltage than elements described as "negative" when the power module is connected to a power source. "Positive" elements are positioned to have an electrical connection that is connectable to the positive terminal of a power source, while "negative" elements are positioned to have an electrical connection that is connectable to a negative terminal, or ground, of the power source. Generally, "positive" elements are located or connected to the high side of the power module and "negative" elements are located or connected to the low side of the power module.

In a typical power module configuration, the high side switches are on one side of the module opposite the corresponding low side switches. A positive DC lead from a power source such as a battery is connected to a conducting layer in the high side of the substrate. Likewise, a negative DC lead from the power source is connected to a conducting layer in the low side of the substrate. The switches control the flow of current from the conducting layers of each half bridge substrate to output leads. Output leads, called "phase terminals" transfer alternating current from the three pairs of switches to the motor.

Power modules typically have three bridges combined into a single three-phase switching module, or single half-bridge modules that may be linked together to form a three-phase switch. As would be understood by one of ordinary skill in the art, the same DC to AC conversion may be accomplished using any number of switching pairs, and each switching pair may contain any number of switches. For simplicity and clarity, all examples herein use a common three phase/three switching pair configuration. However, the invention disclosed herein may be applied to a power module having any number of switches.

Current flows from the positive DC lead to the conducting layer on the high side substrate. Current is then permitted to flow through the switching device on the high side to the conducting layer on the low side. A phase terminal lead allows current to flow from the conducting layer on the low side to the motor. The current then flows from the motor to the conducting layer on the low side of a second switching pair to the negative DC lead to the power source.

Current flowing through various paths within the module creates inductances, which in turn results in inductive power losses, reduced efficiency, and the excess generation of heat. When the flow of current changes, as in such a high frequency switching environment, large voltage overshoots often result, further decreasing switching efficiency. In addition, the DC terminals are commonly attached to one end of the power module, which forces current to travel further to some switches, and thus, for some switching configurations, than for others, resulting in non-uniform current loops. Current loops that are not uniform result in uneven or inefficient motor performance.

These and other problems are avoided and numerous advantages are provided by the device described herein.

BRIEF SUMMARY OF THE INVENTION

The present invention provides a DC bus for use in a power module that is shaped and positioned to minimize the current loops, thus reducing inductive poser losses. The DC bus is also shaped to permit counter-flow of electric currents, thereby canceling magnetic fields and their associated inductances. The DC bus also allows DC current to flow symmetrically and directly to the switches of the module. Symmetric current loops in the module result in more even and efficient motor performance.

Elements may be described herein as "adjacent" another element. By the term "adjacent" is meant that in a relationship so characterized, the components are located proximate to one another, but not necessarily in contact with each other. Normally there will be an absence of other components positioned in between adjacent components, but this is not a requirement. By the term "substantially" is meant that the orientation is as described, with allowances for variations that do not effect the cooperation and relationship of the so described component or components.

In accordance with the present invention, the DC bus for use in a power module has a positive DC conductor bus plate and a negative DC conductor bus plate placed parallel to the positive bus. The positive bus is connected to one or more positive leads, which are connectable to a positive terminal of a power source. The negative bus is connected to one or more negative leads, which are connectable to a negative terminal of a power source. One or more positive connections on the bus are fastenable from the positive bus to the high side of the power modules, and one or more negative connections are fastenable from the negative bus to the low side of the module. The positive bus and the negative bus permit the counter-flow of currents, thereby canceling magnetic fields and their associated inductances, and the positive and negative bus are connectable the power module between the high and low side of the module. Preferably, the DC bus has separate negative leads and separate positive leads for each half-bridge on the module. The DC bus may also include an insulating layer between the positive and negative bus. Preferably, each positive lead is substantially adjacent to a negative lead. The bus may be connected either substantially perpendicular to or substantially parallel to the substrate of the power module.

In another aspect of the invention, a power module for reducing inductance is disclosed. The module has a lead frame for supporting the module and for providing interconnections to the motor and the power source. A substrate is connected to the lead frame. There are one or more pairs of high and low switches at the substrate level of the module. The DC bus described above is placed in the center portion of the power module.

In yet another aspect, the invention is directed to a method of reducing inductance in a power module. The method involves allowing DC current to flow symmetrically and directly to the switches of the module and permitting counter-flow of electric currents, thereby canceling magnetic fields and their associated inductances. The positive and negative leads are positioned in close proximity to one another thereby canceling the magnetic fields and associated inductances.

The DC bus and power module disclosed herein provide improved efficiency and more even motor performance through the cancellation of magnetic fields and minimization of current loops. A parallel negative and positive DC bus provides the added benefit of creating capacitance between the plates, which further minimize voltage overshoots produced by the switching process. These and other advantages will become apparent to those of ordinary skill in the art with reference to the detailed description and drawings.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein

BRIEF DESCRIPTION OF THE SEVERAL VIEWS OF THE DRAWING(S)

FIG. 7 is a cross-sectional side view of the power module with DC busleads.

FIG. 8 is a cross-sectional side view of the power module with DC bus leads and phase terminals.

DETAILED DESCRIPTION OF THE INVENTION

In accordance with the invention, a DC bus is used in a power module, and the DC bus is shaped and positioned to minimize current loops, voltage overshoots and their associated inductance losses, to provide for symmetric current flow. Reference is made herein to a power module with three phase terminals for use with a three-phase motor and having three bridges, each with two switching pairs. As will be appreciated by one of ordinary skill in the art, the disclosed power module, DC bus, and method for reducing inductance in a power module could be used on a power module with any number of phase terminals and bridges, and having any number of switching pairs. Nonetheless, for ease of description, reference is made to a three-phase power module.

Figure 1:
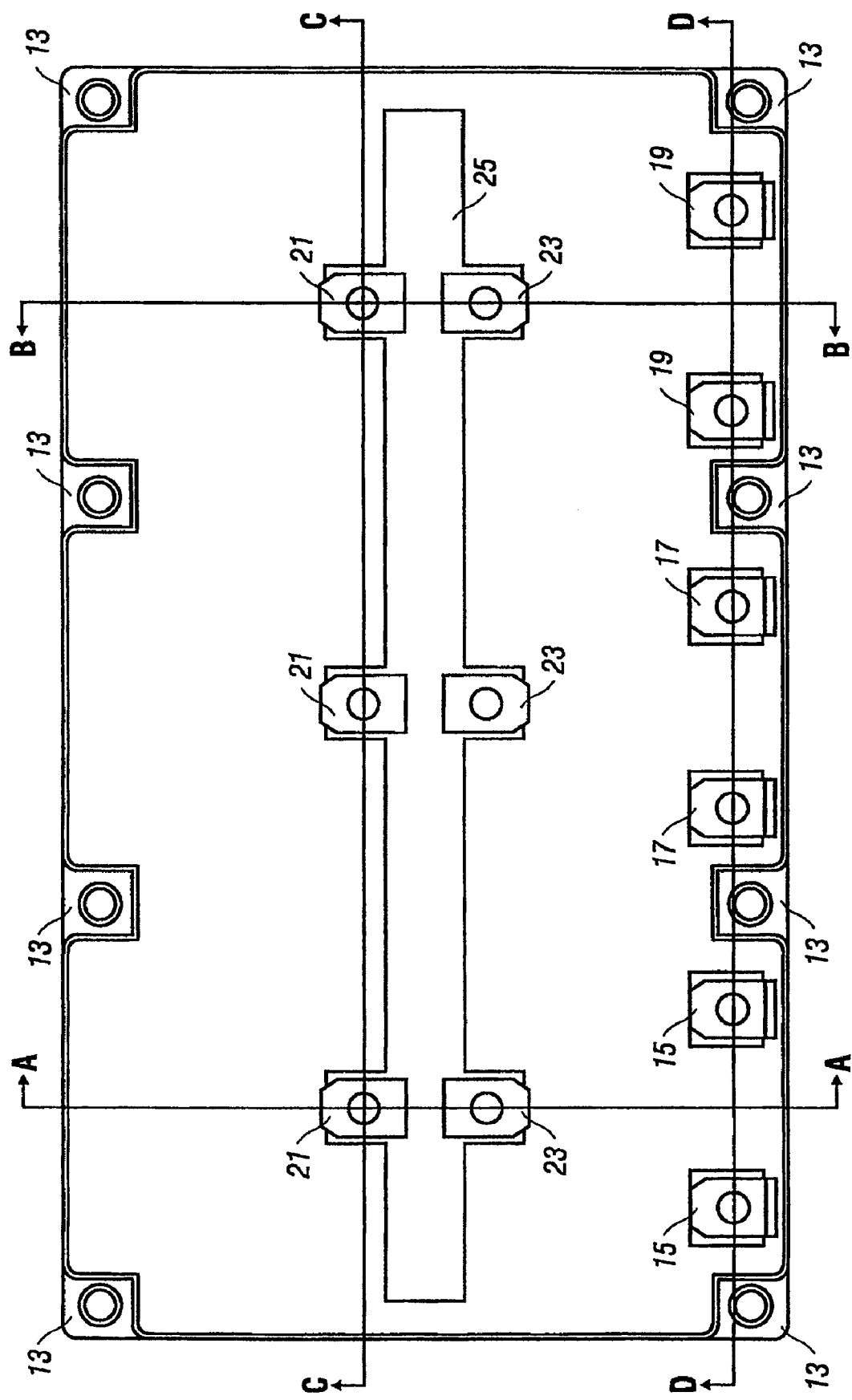
FIG. 1 is an overhead view of the top of the power module.

Referring to FIG. 1, an overhead view of the top of the power module is shown. The module has three positive leads 21 that are connectable to a power source 202 (FIG. 14), such as a battery, and three negative leads 23 that are likewise connectable to the negative terminal of a power source 202 such as a battery, or ground. The module has three sets of phase terminals 15, 17, and 19.

The top of the power module is held in place by fasteners (not shown) through bushings 13. The fasteners are bolts, but other types of fasteners can be substituted therefore, as will be readily apparent to those of ordinary skill in the art. A non-conducting strip 25 holds leads 21 and 23 in place by providing a raised portion into which the leads 21 and 23 may be bolted.

As will be understood by one of ordinary skill in the art, the positive leads 21 and negative leads 23 carry direct current from a battery source to the module. As will be better understood by the following discussion, the power module converts the direct current to alternating current. In a three-phase module such as that shown in FIG. 1, there are at lease three phase terminals 15, 17 and 19 through which the resulting alternating current flows. In the preferred embodiment, there are three sets of two phase terminals 15, 17, and 19.

Figure 2:
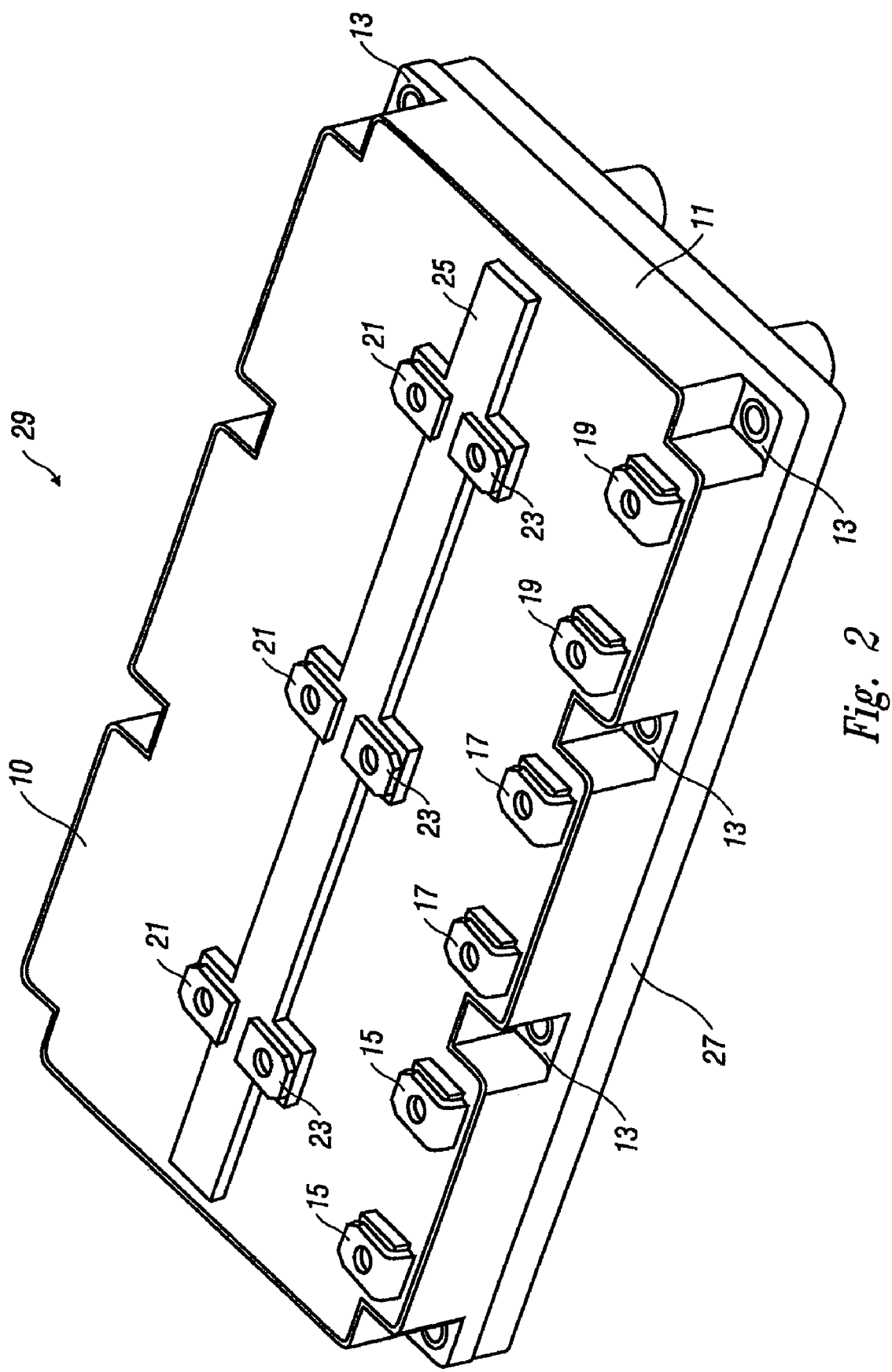
FIG. 2 is a perspective view of the power module.

FIG. 2 is a perspective view of the power module 29. The module has a module frame 11 and top cover 10, which are preferably composed of plastic. The bottom portion is the cooling header 27 of the module, into which a cooling liquid enters, circulates through, and exits, for cooling the module. Sandwiched between the module frame 11 and the cooling header 27 middle portion is the base plate, which contains the printed circuit board, substrate, and switching devices, and is not shown in this view. FIG. 2 shows the positive leads 21 and negative leads 23, and phase terminals 15, 17, and 19. The module frame 11 is bolted to the cooling header 27 with bushings 13.

Figure 3:
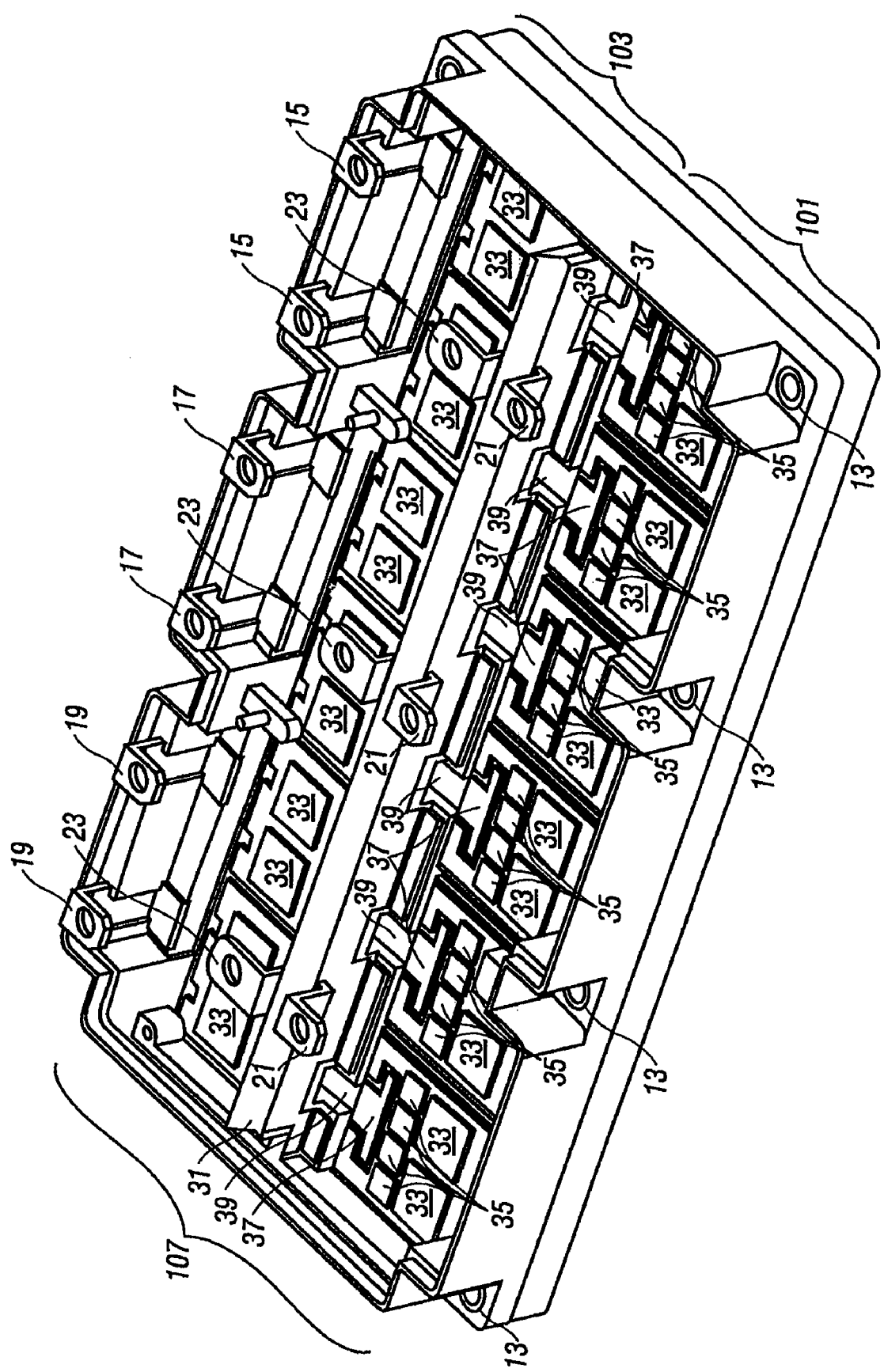
FIG. 3 is a perspective view of the power module without its top portion and with the substrate exposed.

FIG. 3 is a perspective view of the power module, shown without its top cover portion 10 and with the substrate 107 removed. The DC bus 31 has a separate positive bus plate and a negative bus plate, as is better illustrated in FIGS. 5-6, and 9-13. The DC bus 31 is arranged perpendicular to the substrate 107. As would be understood by one of ordinary skill in the art, the substrate has conducting layers separated by an insulating layer for carrying and controlling a current flow. The substrate 107 has a high side 101 and a low side 103. The substrate 107 includes switches 33, which can be IGBTs, MOS, or MOSFETs, and diodes 35 for controlling current flow. The switches 33 are preferably IGBTs. The switches 33 and diodes 35 are electrically connected, preferably by wire bonding.

Figure 14:
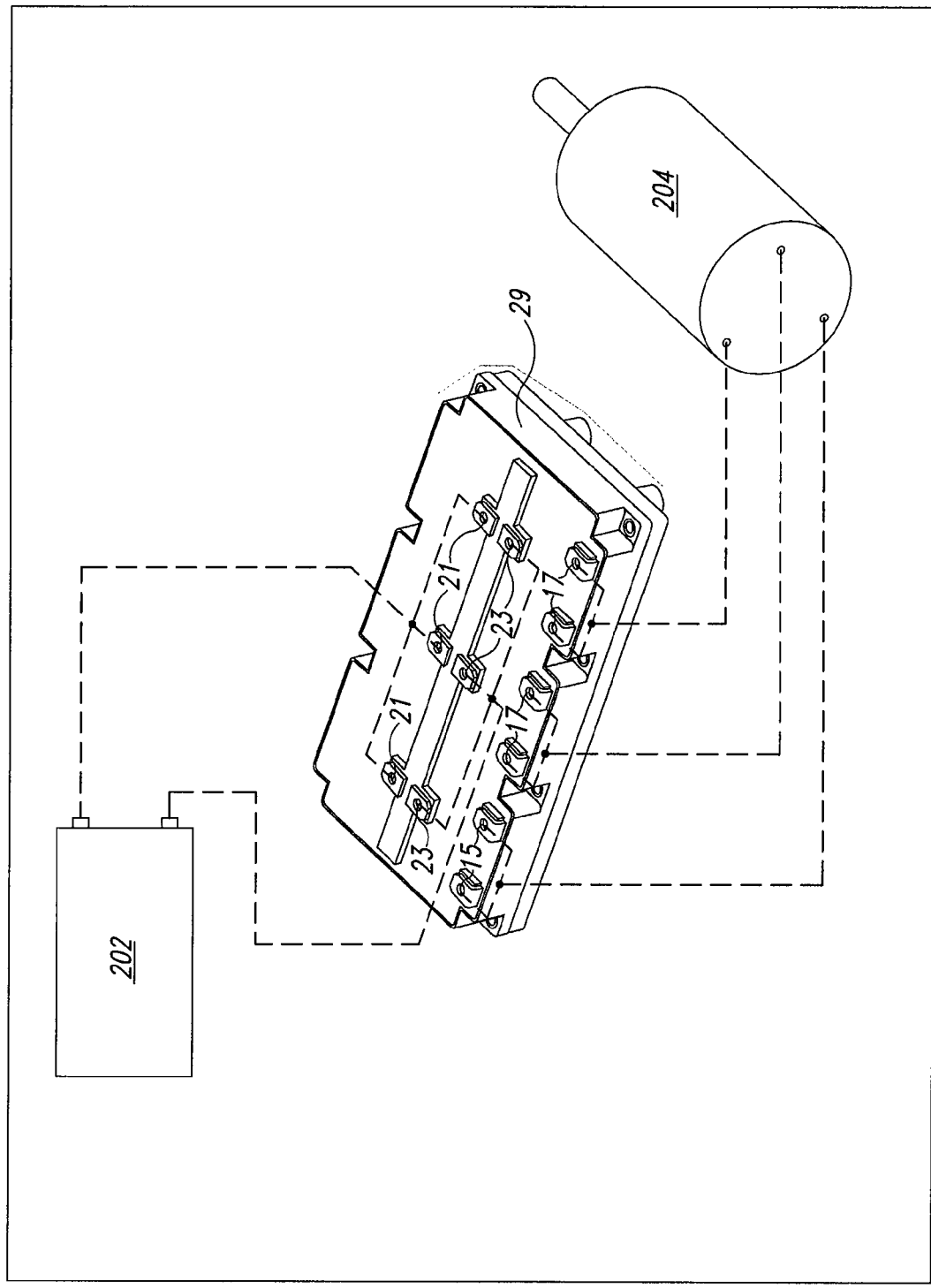
FIG. 14 is a schematic drawing of a power system according to one embodiment, including a power module electrically coupled between a power source or power supply, and a load.

As will be understood by one of ordinary skill in the art, direct current flows from a power source 202 such as a battery to the positive DC leads 21 and to the DC conductor bus plates 31. Current flows to a conducting layer in the high side 101 of the power module. The current flows through the switches 33 and diodes 35 on the high side 101 through a conducting plate 37. The conducting plate 37 is connected to a conducting layer in the low side 103 of the power module by a connection located through a cut-out passage 39 underneath the bus bar. Current then flows from the conducting layer on the low side 103 through one of the sets of phase terminals 15, 17, or 19 to a three-phase motor 204 (FIG. 14). Current from the motor 204 flows back to another set of phase terminals 15, 17, or 19, where it flows from the conducting layer on the low side 103 to the negative lead 23 of the bus bar 31 and back to the power source 202.

FIG. 3 also shows pairs of phase terminals 15, 17, and 19. Three single phase terminals may be substituted for phase terminal pairs 15, 17, and 19. Alternatively, each phase terminal grouping, shown as pairs 15, 17, and 19, may include more than two phase terminals. Pairs of phase terminals 15, 17, and 19 are used for ease of connecting to switches 33 on the high side 103 of the power module.

Three positive DC leads 21 and three negative DC leads 23 are also shown. Each lead 21 and 23 is placed central to a switching pair half-bridge corresponding to each of the phase terminals 15, 17, or 19. Although other lead configurations are possible, this placement of DC leads 21 and 23 provides for more uniform current flow as opposed to previous modules having only a single DC lead.

Figure 4:
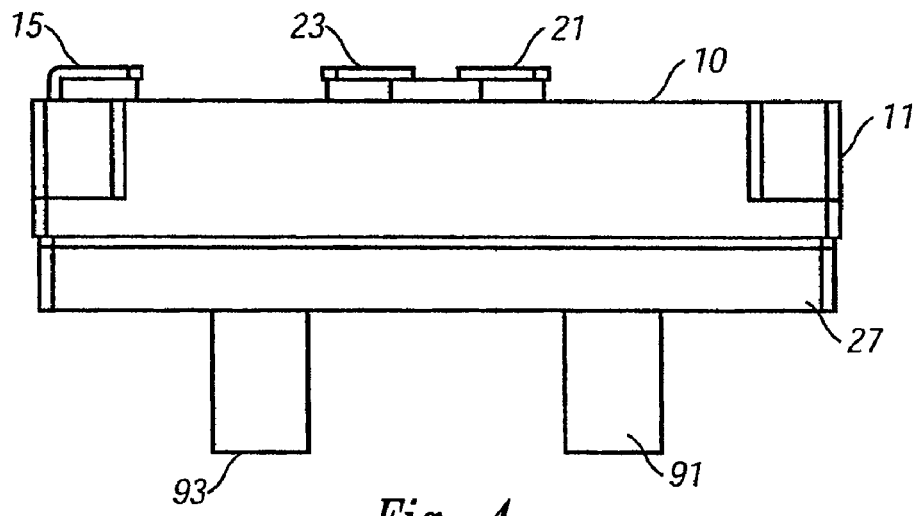
FIG. 4 is the side view of the power module.

FIG. 4 is a side view of the power module, with DC leads 21 and 23, phase terminal 15, and module frame 11. The bottom cooling header 27 includes an intake for coolant 91 and an outlet for coolant 93.

Figure 5:
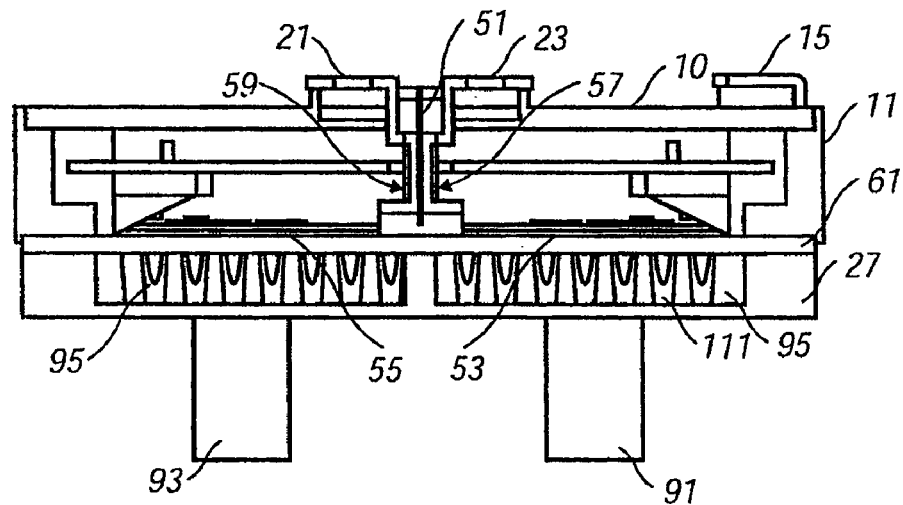
FIG. 5 is a cross-sectional front view of the power module with cooling intake and outlet.

Referring now to FIG. 5, a cross-sectional front view of the power module with cooling intake 91 and outlet 93 is shown. The cooling header 27 includes a cavity 95 through which a coolant, such as water, may flow. The cavity 95 includes thermal conducting projections 111. The cooling header 27 is fastened to the base plate 61, which supports the high side switching assembly 55 and low side switching assembly 53. The phase terminal 15 is also shown. FIG. 5 illustrates the cross section of the DC bus at the point having DC leads 21 and 23. The DC bus has a positive conductor plate 59 arranged parallel to a negative conductor plate 57. An electrically insulating layer 51, preferably made from plastic or tape, is placed between the positive bus plate 59 and the negative bus plate 57. Alternatively, enough space may be left between the plates 57 and 59 to provide an insulating layer of air or silicone gel. The electrically insulating layer 51 permits more uniform spacing and closer spacing between the positive and negative buses 57 and 59.

Thus, counter flow of current is permitted, thereby canceling the magnetic fields and their associated inductances. In addition, the parallel bus plates 57 and 59 create capacitance. As will be understood by one of ordinary skill in the art, a capacitor dampens voltage overshoots that are caused by the switching process. Thus, the DC bus plates 57 and 59 create a field cancellation as a result of the counter flow of current, and capacitance damping as a result of also establishing a functional capacitance between them. FIG. 5 shows the DC bus plates 57 and 59 placed perpendicular to the high and low side substrates 53 and 55, however, the DC bus plates 57 and 59 may also be placed parallel to the substrates 53 and 55 and still achieve counter flow of current and reduced inductances.

In various embodiments at least a portion of the materials, referred to herein, which have not been herein identified, described, and/or understood by one having ordinary skill in the art as conductive or semi-conductive (e.g., the materials used in module frame 11, top cover 10, the electrically insulating layer 51, etc.), can provide electrical isolation properties (e.g., dielectric properties such as those possessed by some plastics and glass). In one implementation, such dielectric properties include a dielectric strength of approximately 20 kV/mm or greater. In another implementation, such dielectric properties include a dielectric strength of 26 kV/mm. In another implementation, such dielectric properties include an ability to provide dielectric isolation from at or around 2 kV to at or around 5 kV. In another implementation, at least a portion of the materials, referred to herein, which have not been herein identified, described, and/or understood by one having ordinary skill in the art as conductive or semi-conductive, retain their dielectric properties (such as the foregoing-described dielectric properties) subsequent to undergoing an injection molding process; for example, undergoing injection molding at or around a temperature of 330 degrees centigrade and at or around a pressure of 50 mega-Pascals.

In various embodiments at least a portion of the materials, referred to herein, which have not been herein identified, described, and/or understood by one having ordinary skill in the art as conductive or semi-conductive (e.g., the materials used in various implementations of the electrically insulating layer 51, etc.), have varying thicknesses. In one implementation, where the materials are to provide electrical isolation between conducting materials (e.g., the electrically insulating layer 51 between positive bus plate 59 and the negative bus plate 57), the thickness of the materials is a design choice dependent upon a tradeoff between electrical advantage (e.g., generally, provided the materials can still perform the desired electrical isolation, thinner materials are preferable) and mechanical advantage (e.g., if the materials are too thin they may be mechanically unstable, and hence may fracture under normal operation). In one implementation, the thickness of the materials ranges from 0.1 mm to 1.0 mm. In another implementation, the thickness of the materials is 0.3 mm.

In one implementation, at least a portion of the materials, referred to herein, which have not been herein identified, described, and/or understood by one having ordinary skill in the art as conductive or semi-conductive, can be composites of materials, such as composites of plastics and glass. For example, in one implementation the module frame 11, the top cover 10, and the electrically insulating layer 51, which have previously been described as composed of plastic, are instead implemented as composites of plastic and glass. In one implementation, the electrically insulating layer 51 has a lower glass content and a higher plastic content in order to provide better dielectric isolation, while the module frame 11, and the top cover 10, have a higher glass content and a lower plastic content to provide better mechanical stability. Those having ordinary skill in the art will appreciate that glass provides both mechanical strength and dimensional stability (e.g., glass generally doesn't immoderately expand or contract with temperature).

In one implementation, at least a portion of the materials, referred to herein, which have not been herein identified, described, and/or understood by one having ordinary skill in the art as conductive or semi-conductive, can be used to form various embodiments of structures described herein in various ways. For example, in one implementation, the electrically insulating layer 51 is formed separately and mechanically integrated with other components as described herein, while in another implementation, the electrically insulating layer 51 is formed of a piece with other components as described herein via an injection molding process (e.g., injection molding module frame 11 and the electrically insulating layer 51 as one piece).

In various embodiments at least a portion of the materials, referred to herein, which have not been herein identified, described, and/or understood by one having ordinary skill in the art as conductive or semi-conductive have been implemented using any one or more of the following commercially-available materials: the NOMEX material available from the Dupont Company; Advanced Fibers Systems, 7070 Mississauga Road, Mississauga, Ontario L5M 2H3, Canada; the CIRLEX material available from the FRALOCK Company, 120 Industrial Road, San Carlos, Calif. 94070; a Polyphthalamide (PPA) material such as AMODEL AF-1133 VO Engineering Resin available from Amoco Polymers, Inc, 4500 McGinnis Ferry Road, Alpharetta, Ga. 30202-3914; the NORYL GTX830 material available from GE Plastics, One Plastics Avenue, Pittsfield, Mass. 01201; and the Heater Samicanite material available from Isola Composites, 90101 DELLE France.

The cooling system is further illustrated in FIG. 5. Heat produced by the power module is conducted through the base plate 61 and the conducting projections 111 to the coolant cavities 95. Coolant flows into the coolant intake 91, through the cavities 95, and out coolant intake 93, thereby dissipating heat energy from the power module.

Figure 6:
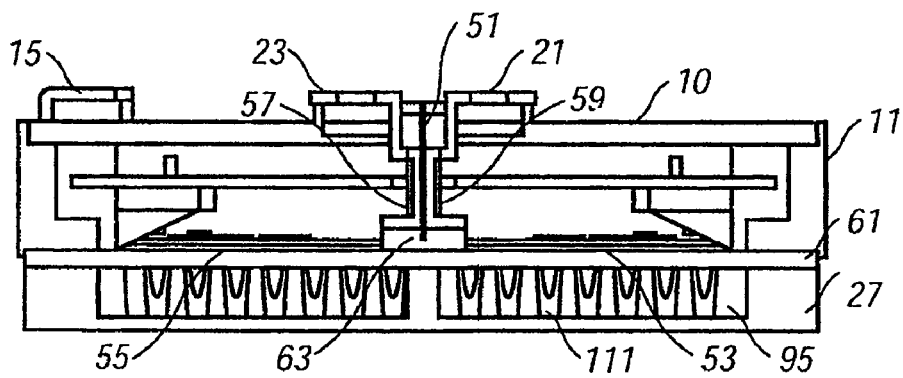
FIG. 6 is a cross-sectional front view of the power module without cooling intake and out take.

Referring now to FIG. 6, a cross-sectional front view of the power module without cooling intake and out take is shown.

Turning now to FIG. 7, a cross-sectional side view of the power module with DC bus leads is shown. The coolant cavity 95 runs the length of the module to intake 91. The high side substrate switches 55 are shown inside the module 29 with positive DC leads 21.

FIG. 8 is a cross-sectional side view of the power module with negative DC bus leads 23 and phase terminals 15, 17, and 19.

Figure 9:
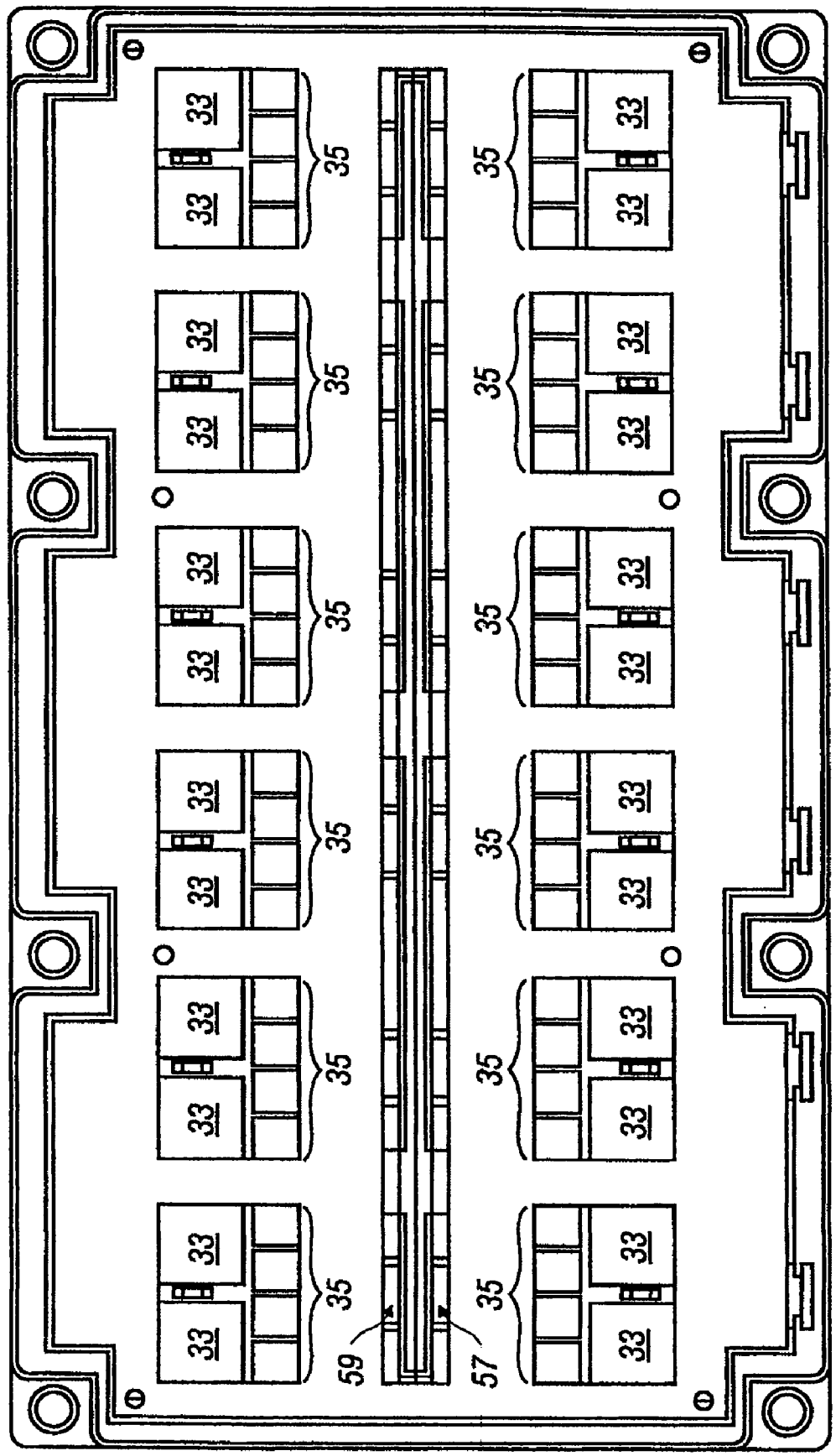
FIG. 9 is a top overhead view of the devices on the substrate in the module.

FIG. 9 is a top overhead view of the switching devices 33 and diodes 35 on the substrate of the module. The positive DC bus plate 59 and the negative DC bus plate 57 are also shown.

Figure 10:
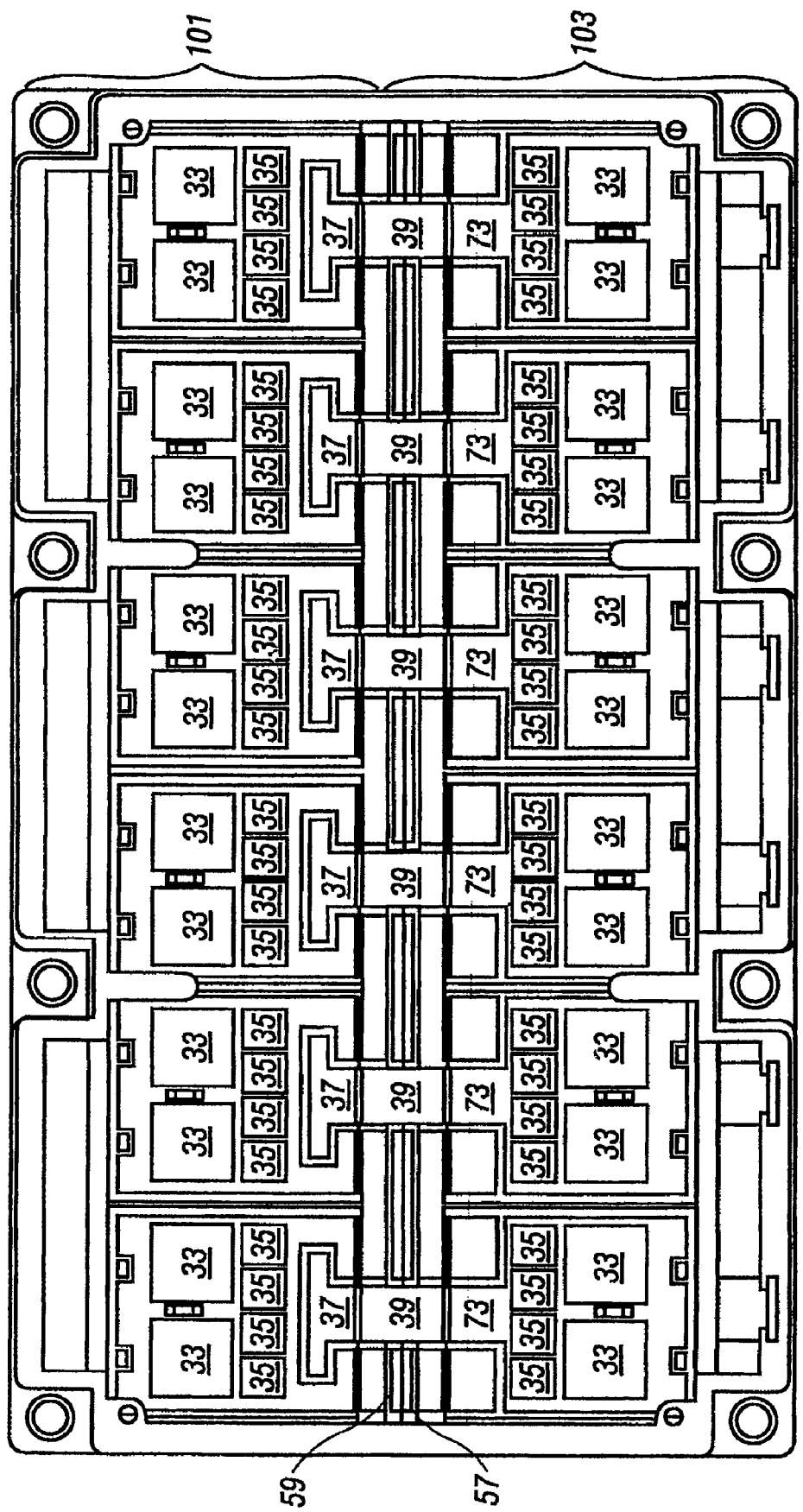
FIG. 10 is a top overhead view of the printed circuit board in the module.

Referring now to FIG. 10, a top overhead view of the printed circuit board in the module is shown. The positive DC bus plate 59 is allowed to extend into a high side slot in the middle of the module, and the negative DC bus plate 57 is allowed to extend into a low side slot in the middle of the module. The DC bus plate has openings for a passage 39 from the high side 101 to the low side 103. Substrate switches 33 and diodes 35 are shown on a printed circuit board. As stated in the discussion accompanying FIG. 3, the current must be able to flow from the conducting layer on the high side 101 of the substrate to the conducting layer on the low side 103 of the substrate. The current flows from the conducting layer of the substrate on the high side 101, through the switches 33 and diodes 35 to the conducting plate 37. The conducting plate 37 is connected through the passage 39 to a plate 73 on the low side 103 of the module.

Figure 11:
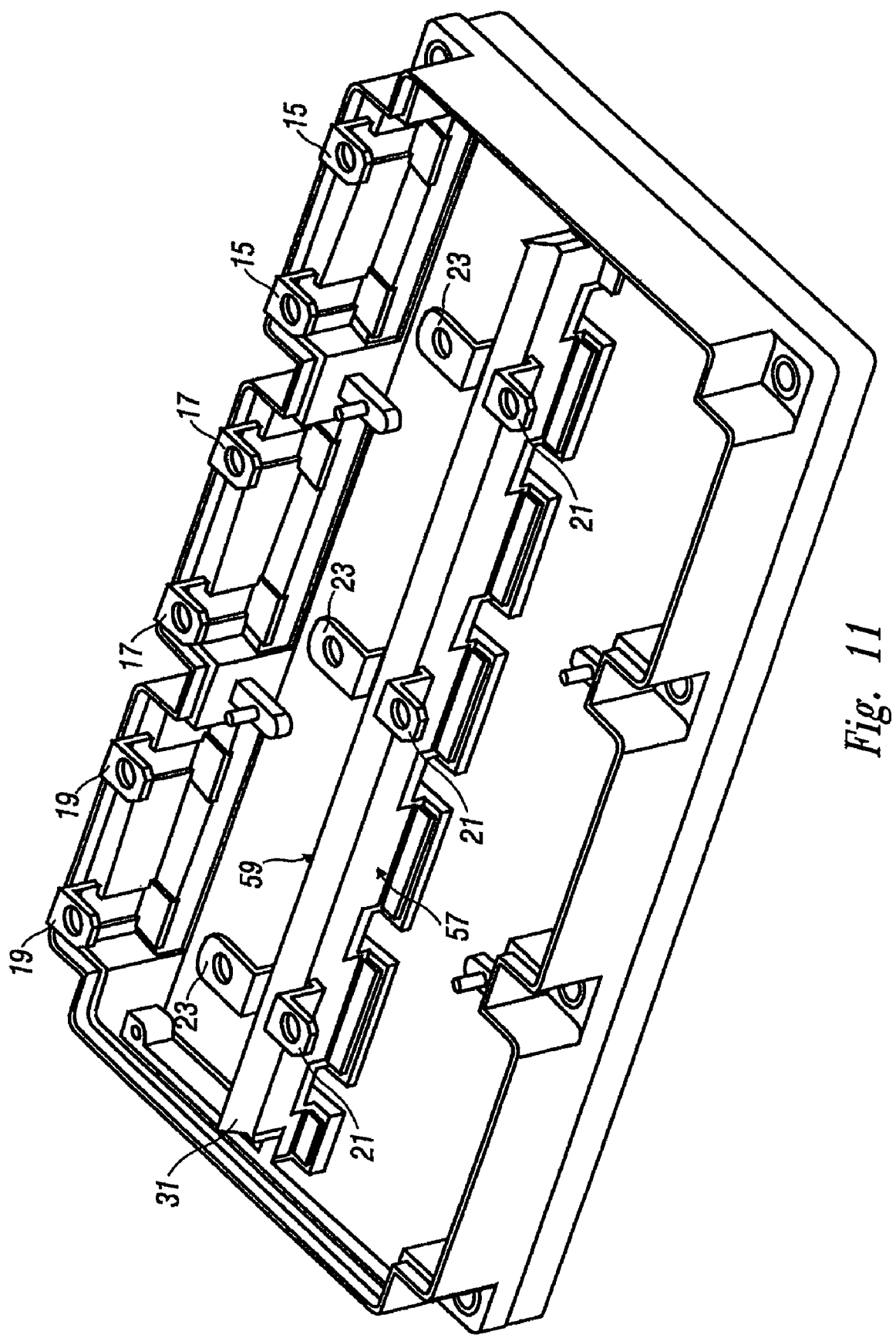
FIG. 11 is a perspective view of the power module and DC bus with the printed circuit board removed.

Referring now to FIG. 11 a perspective view of the power module and DC bus with the printed circuit board, substrate, and switches removed is shown. The DC bus 31 has positive leads 21 connected to the positive bus plate 57 and negative leads 23 connected to a negative bus plate 59.

Figure 12:
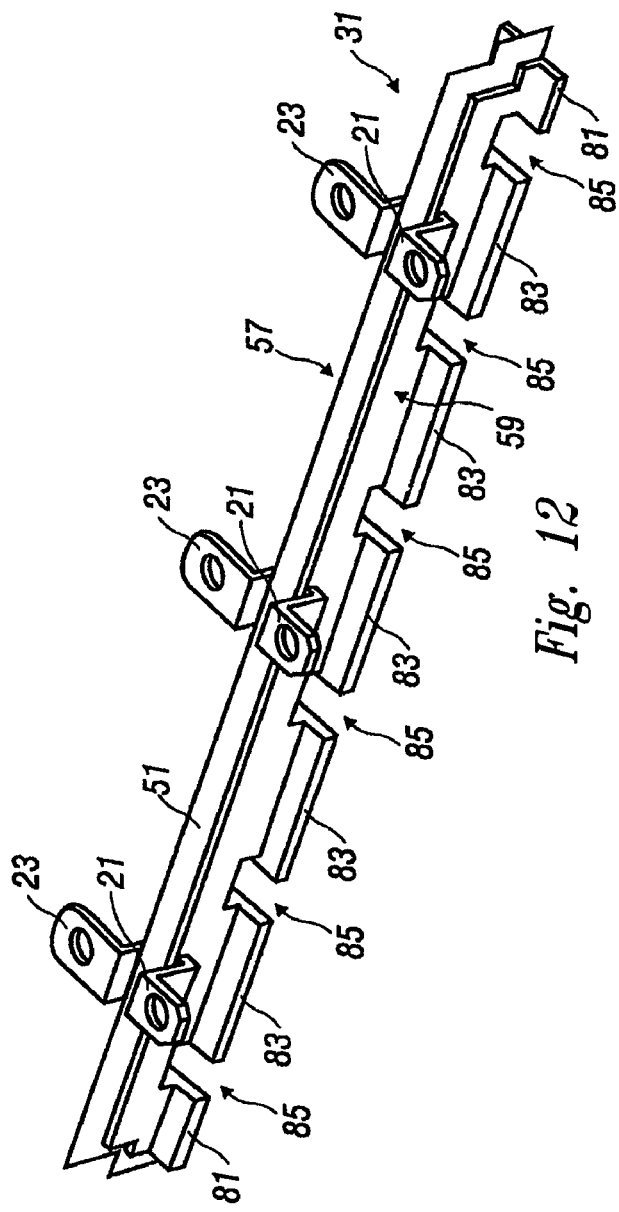
FIG. 12 is a perspective view of the DC bus.

FIG. 12 is a perspective view of the DC bus. The DC bus 31 has positive DC leads 21 connected to a positive plate 59. The positive plate is in parallel with a negative plate 57, which is connected to negative DC leads 23. The plates are optionally separated by a non-conducting layer 51. The DC bus 31 has shorter tabs 81 and longer tabs 83 for forming a connection with the connecting layer of the substrate. Preferably, the tabs 81 and 83 are wire bonded to the conducting layer of the substrate. The DC bus 31 also has openings 85 through which connections may be made from the high side of the substrate to the low side of the substrate.

Figure 13:
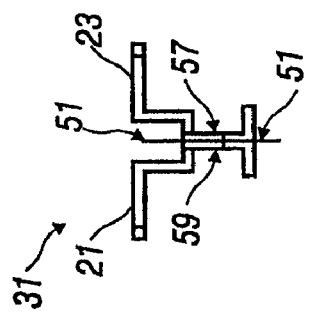
FIG. 13 is a cross-sectional view of the DC bus.

FIG. 13 is a cross-sectional view of the DC bus 31. A non-conducting layer 51 separates the negative bus plate 57 from the positive bus plate 59. Positive DC lead 21 and negative DC lead 23 are also shown.

FIG. 14 is a schematic drawing of a power system 200 according to one illustrated embodiment. The power system 200 includes a power module 29 electrically coupled between a power supply or power source 202, for example, a DC power source such as a battery, ultra-capacitor or fuel cell, and an AC load, for example, an electric machine such as an electric motor 204, for example, a three-phase AC electric motor.

The figures disclosed herein are merely exemplary of the invention, and the invention may be embodied in various and alternative forms. The figures are not necessarily to scale. Some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Having thus described the invention, the same will become better understood from the appended claims in which it is set forth in a non-limiting manner.

The invention claimed is:

1. A method of reducing inductance in a power module comprising:
   allowing DC current to flow symmetrically and directly to the switches of the module;
   permitting counter-flow of electric currents, thereby canceling magnetic fields and their associated inductances; and
   simultaneously positioning the positive and negative leads in close proximity to one another thereby canceling the magnetic fields and their associated inductance.

2. The method of claim 1, further comprising:
   mounting a DC positive bus plate and a DC negative bus plate parallel to one another between the high and the low side of the power module.

3. The method of claim 1, further comprising:
   placing an insulating layer between the positive bus and the negative bus.

4. The method of claim 1, further comprising:
   providing separate power leads to each half-bridge of the power module.

5. The method of claim 1 wherein said step of allowing DC current to flow symmetrically and directly to the switches of the module comprises:
   allowing current to flow from a negative terminal of a power source directly to said switches without being redirected through any additional components, and
   allowing current to flow from a positive terminal of a power source directly to said switches without being redirected through any additional components.

6. The method of claim 5 wherein said step of allowing DC current to flow symmetrically and directly to the switches of the module comprises allowing current from a negative terminal of a power source, and current from a positive terminal of a power source to flow symmetrically to said switches.

7. The method of claim 1 wherein said step of allowing DC current to flow symmetrically and directly to the switches of the module comprises allowing current from a negative terminal of a power source, and current from a positive terminal of a power source to flow symmetrically to said switches.

8. The method of claim 1 wherein a first circuit within said module directly connected to a positive lead of said module and a second circuit within said module directly connected to a negative lead of said module are symmetrical.

9. The method of claim 8 wherein said first and second circuits are symmetrical about an axis defined by adjacent edges of said first and second circuit.

* * * * *